United States Patent [19]
Miyashita et al.

[11] Patent Number: 5,578,159
[45] Date of Patent: Nov. 26, 1996

[54] HOT PRESS FOR PRODUCING MULTILAYER CIRCUIT BOARD

[75] Inventors: Akimi Miyashita, Toride; Mutsumasa Fujii, Ibaraki-ken; Kenichi Takahashi, Nagareyama; Masami Iwakura, Shimodate; Makoto Kato, Shimodate, all of Japan

[73] Assignee: Hitachi Techno Engineering Co., Ltd., Tokyo, Japan

[21] Appl. No.: 257,519

[22] Filed: Jun. 9, 1994

[30] Foreign Application Priority Data

Jun. 29, 1993 [JP] Japan .................. 5-159130
Oct. 8, 1993 [JP] Japan .................. 5-253084

[51] Int. Cl.⁶ .................................................. B32B 31/00
[52] U.S. Cl. .............. 156/358; 156/359; 156/583.1; 156/583.3; 100/48; 100/51; 100/93 P
[58] Field of Search .......................... 156/358, 359, 156/580, 583.1, 583.3; 100/48, 50, 51, 93 R, 93 P

[56] References Cited

U.S. PATENT DOCUMENTS

| | | | |
|---|---|---|---|
| 3,925,139 | 12/1975 | Simmons | 156/358 |
| 3,935,053 | 1/1976 | Armstrong, Jr. | 156/358 X |
| 3,979,248 | 9/1976 | Kussmaul | 156/358 |
| 4,264,394 | 4/1981 | Izumihara | 156/358 |
| 4,367,115 | 1/1983 | Bohn et al. | 156/358 |
| 4,806,195 | 2/1989 | Namysl | 156/583.3 X |
| 4,986,870 | 1/1991 | Frohlich | 156/583.3 X |

FOREIGN PATENT DOCUMENTS

| | | |
|---|---|---|
| 59-191600 | 10/1984 | Japan . |
| 61-43543 | 3/1986 | Japan . |
| 61-43565 | 3/1986 | Japan . |
| 62-156931 | 7/1987 | Japan . |
| 3-128195 | 10/1989 | Japan . |

*Primary Examiner*—David A. Simmons
*Assistant Examiner*—Paul M. Rivard
*Attorney, Agent, or Firm*—Antonelli, Terry, Stout & Kraus

[57] ABSTRACT

In a hot press according to the present invention, a control panel detects the fact that the viscosity of bonding resin of multilayer circuit board materials is minimized by taking thereinto at least one of the values measured by a speed sensor of a lower bolster, a measuring portion for measuring a control current of an electromagnetic proportional relief valve and a relief amount detector for detecting the relief amount of the electromagnetic proportional relief valve, and gives an instruction of an optimum air pressure addition timing. Accordingly, even if the multilayer circuit board materials and the like are varied, it is always possible to change over from a vacuum condition to an air pressure added condition at the best timing, thereby making it possible to obtain a multilayer circuit board of a uniform thickness without causing generation of void.

11 Claims, 9 Drawing Sheets

HOT PRESS FOR PRODUCING MULTILAYER CIRCUIT BOARD

BACKGROUND OF THE INVENTION

The present invention relates to a press used for producing multilayer circuit boards, and more particularly, to a hot press which is suitable for forming a high-density and high-quality multilayer circuit board at low cost.

A multilayer circuit board is generally produced in the following manner. Namely, a predetermined number of printed circuit boards each printed with a predetermined circuit pattern and a predetermined number of prepregs formed by a cloth base material impregnated with a bonding resin are stacked in layers and, then, the materials of multilayer circuit board comprising the printed circuit boards and the prepregs thus stacked in layers are heated and pressed by hot plates. Accordingly, at the same time when the temperature is raised, the bonding resin softens to fluidify to reach its minimum viscosity, and thereafter, with the progress of chemical reaction, it becomes hard to be stable. As a result, the plurality of printed circuit boards are bonded to each other by the bonding resin of the prepregs to be one body, a multilayer circuit board is produced.

In order to enhance the density of the above-described multilayer circuit board, it is necessary to prevent the oxidation of junctions and to remove voids from between the layers of the multilayer circuit board. Accordingly, it has been proposed to carry out the hot press operation in a high vacuum.

In Japanese Patent Unexamined Publication No. 62-156931, for example, it is disclosed that the materials of the multilayer circuit board are covered with a film or a sheet and, after reducing the pressure inside the film or the sheet, the materials of the multilayer circuit board are heated and pressed by the hot plates.

Further, Japanese Patent Unexamined Publication Nos. 61-43543 and 61-43565 disclose a method which makes use of a high pressure container named "autoclave" and according to which the materials of the multilayer circuit board are covered with a film or a sheet and, after reducing the pressure inside the film or the sheet, the materials of the multilayer circuit board are heated and pressed by $N_2$ gas or $CO_2$ gas within the high pressure container.

In addition, Japanese Patent Unexamined Publication No. 3-128195 discloses a method in which heat and pressure are applied uniformly to the materials of the multilayer circuit board by the hot plates serving to heat the materials of the multilayer circuit board and by upper and lower bolsters serving to press the materials of the multilayer circuit board, a space formed between the upper and lower bolsters is enclosed by sealing means, the inside of the sealing means is kept at a vacuum (reduced pressure) until the bonding resin of the prepregs softens to fluidify and, after the bonding resin becomes into fluidified state, the pressure in the sealing means is increased to a high pressure (added with an air pressure) and kept at the high pressure during the hardening of the bonding resin, thereby making the pressure distribution uniform when the materials of the multilayer circuit board are bonded.

In the above-described step of bonding the materials of the multilayer circuit board, the best time for changing over from the vacuum atmosphere to the high pressure atmosphere is the time when the bonding resin of the prepregs softens to fluidify (when the viscosity of the bonding resin of the prepregs reaches the minimum viscosity). If the changing over time is advanced, it becomes liable to generate void. Further, even if no visible void is generated, the heat resistance and the stripping strength are inevitably deteriorated. On the other hand, if the changing over time is delayed, the bonding resin flows out in the peripheral portion of the materials of the multilayer circuit board to make the thickness of the formed multilayer circuit board smaller in the peripheral portion thereof than in the central portion thereof, thereby reducing the merit of the uniform-thickness forming that is the essential merit of the conventional air pressure added press described thirdly in the above. If the changing time is further delayed, solvent or gas in the hardened resin is induced to become the source of generation of void.

In addition, the time at which the bonding resin of the multilayer circuit board softens to fluidify in the bonding step is differed in accordance with an amount of materials of the multilayer circuit board inserted between the hot plates, the viscosity characteristic of the bonding resin, rate of temperature rise of the hot plates, heat capacities of jig plates and construction stores, and the like. Moreover, the temperature rise is differed between the portion close to the hot plate and the portion remote from the hot plate owing to the difference in heat transmission, resulting in a difference in the softening and fluidifying time described above. Particularly, in the case that the amount of materials of the multilayer circuit board inserted between the hot plates is large, a discrepancy in the above-described softening and fluidifying time becomes large. To cope with this, it is general to try to decrease the difference in temperature between the inserted materials of the multilayer circuit board by adding several sheets of cushion papers to the materials adjacent to the hot plate, adjusting the rate of temperature rise of the press body and the like means. As described above, estimation of the time at which the viscosity of the bonding resin is minimized is difficult and full of mistakes.

However, in the conventional bonding operation of the materials of the multilayer circuit board, although these circumstances have been considered to a certain extent, the working conditions have been decided according to the experience and sense of workers. In consequence, the amount of unevenness in quality of the formed multilayer circuit boards was large. Further, the unevenness in quality is brought about an increase of cost of the formed multilayer circuit board.

The unevenness in quality is brought about by non-uniform pressing by the upper and lower bolsters as well.

Namely, even if the contacting surfaces between the upper and lower hot plates and the materials of the multilayer circuit board facing each other are parallel with each other, there is caused a pressure distribution that the pressure is the largest in the central portion of the circuit board materials and becomes smaller as going toward the peripheral portion thereof attributable to a friction generated between the hot plates and circuit board materials. Such pressure distribution is generated at both contacting surfaces between the hot plates and the circuit board materials. The pressure is transmitted to heat insulating boards provided between the hot plates and the bolsters. The Young's modulus of each heat insulating board is very small as being less than about a hundredth of that of an iron-base material (hot plate material), so that the heat insulating board is easy to deform. For this reason, each heat insulating board is deformed in a shape that the thickness thereof is small in the central portion but large in the peripheral portion. Owing to such deformation of the heat insulating boards, the multilayer circuit board has a large thickness in the central portion but a small thickness in the peripheral portion, so that it is easy for void to remain inside the multilayer circuit board.

To solve the above problem, as disclosed in Japanese Patent Unexamined Publication No. 59-191600, it has been conventionally proposed to form a multilayer circuit board of a uniform thickness by providing between the bolster and the heat insulating board a thickness adjusting mechanism which is capable of partly changing the height so as to correct the deflection of the hot plate caused by the deformation of the heat insulating board.

However, by using the thickness adjusting mechanism, only the portion in which the thickness adjusting mechanism is provided was pressed strongly but the other portions were beyond adjustment, and accordingly, the pressure distribution could not be made uniform. As a result, there was formed a multilayer circuit board the thickness of which was corrected partly and hence which was hard to be referred to as multilayer circuit board of a uniform thickness.

SUMMARY OF THE INVENTION

An object of the present invention is to provide a hot press which is suitable to form a high-density and high-quality multilayer circuit board at low cost.

Another object of the present invention is to provide a hot press which makes it possible to coincide the time at which a vacuum atmosphere is changed to a high pressure atmosphere with the time at which a bonding resin of prepreg softens to fluidify, and which is capable of producing a multilayer circuit board of a uniform thickness without generating any void.

Still another object of the present invention is to provide a hot press which makes it possible to coincide the time at which a vacuum atmosphere is changed over to a high pressure atmosphere with the time at which a bonding resin of prepreg softens to fluidify without relying on experience or sense of workers even if the materials of a multilayer circuit board or the production conditions are varied, and which is capable of producing the multilayer circuit boards which are freed from unevenness in quality.

To achieve the above objects, a hot press according to the present invention comprises means for detecting a fact that the viscosity of bonding resin of prepreg reaches its minimum viscosity and means for changing over an atmosphere surrounding the materials of multilayer circuit board from a vacuum condition to a high-pressure condition substantially simultaneously with the time at which the pressure applied to the materials of multilayer circuit board by pressing means is changed over from are-pressure to a bonding pressure larger than the pre-pressure in accordance with a detection result of the detecting means.

Further, in the present invention, the means for detecting the fact that the viscosity of the bonding resin of the multilayer circuit board reaches its minimum viscosity is one of those which detect a fact that moving speed of the pressing means for pressing the materials of multilayer circuit board is maximized, a fact that a relief amount of a pressure control valve of the pressing means is minimized and a fact that control current of the pressure control valve of the pressing means is maximized, respectively, or is formed by combining them.

With the construction described above, according to the present invention, the time at which the viscosity of the bonding resin of the multilayer circuit board is minimized is not estimated from the experience and experiment but the softening-fluidifying point of the bonding resin of the multilayer circuit board is found by detecting a change of the condition of the pressing means caused during the prepressing and preheating. As a result, in comparison with the prior art in which the working conditions have been determined according to the experience and sense of the workers, an amount of scatter in the quality of the formed multilayer circuit boards is small, with the result that it is possible to produce a high-density and high-quality multilayer circuit board at low cost.

To achieve the above objects, there is provided according to the present invention a hot press in which a mechanism for correcting deformation of a heat insulating board caused at the time of heating and pressing the circuit board materials is provided between a bolster and the heat insulating board, or in which one of the heat insulating board and a hot plate serves as the heat insulating board deformation correcting mechanism.

Further, there is provided according to the present invention a hot press in which between a bolster and a heat insulating board is provided a heat insulating board deformation correcting mechanism which is formed by a pressure container made of an elastic member and divided into a plurality of pressure chambers so that, when the pressure chambers are supplied with pressurized fluid, the correcting mechanism changes its shape into an arbitrary, continuous and smooth one.

The heat insulating board deformation correcting mechanism can correct the deflection of the heat insulating board so that the circuit board materials can be pressed uniformly and continuously with a surface pressure having a smooth pressure distribution. It is therefore possible to obtain a multilayer circuit board of a uniform thickness and a good flatness with no generation of void.

DESCRIPTION OF THE PREFERRED EMBODIMENTS

Figure 1:
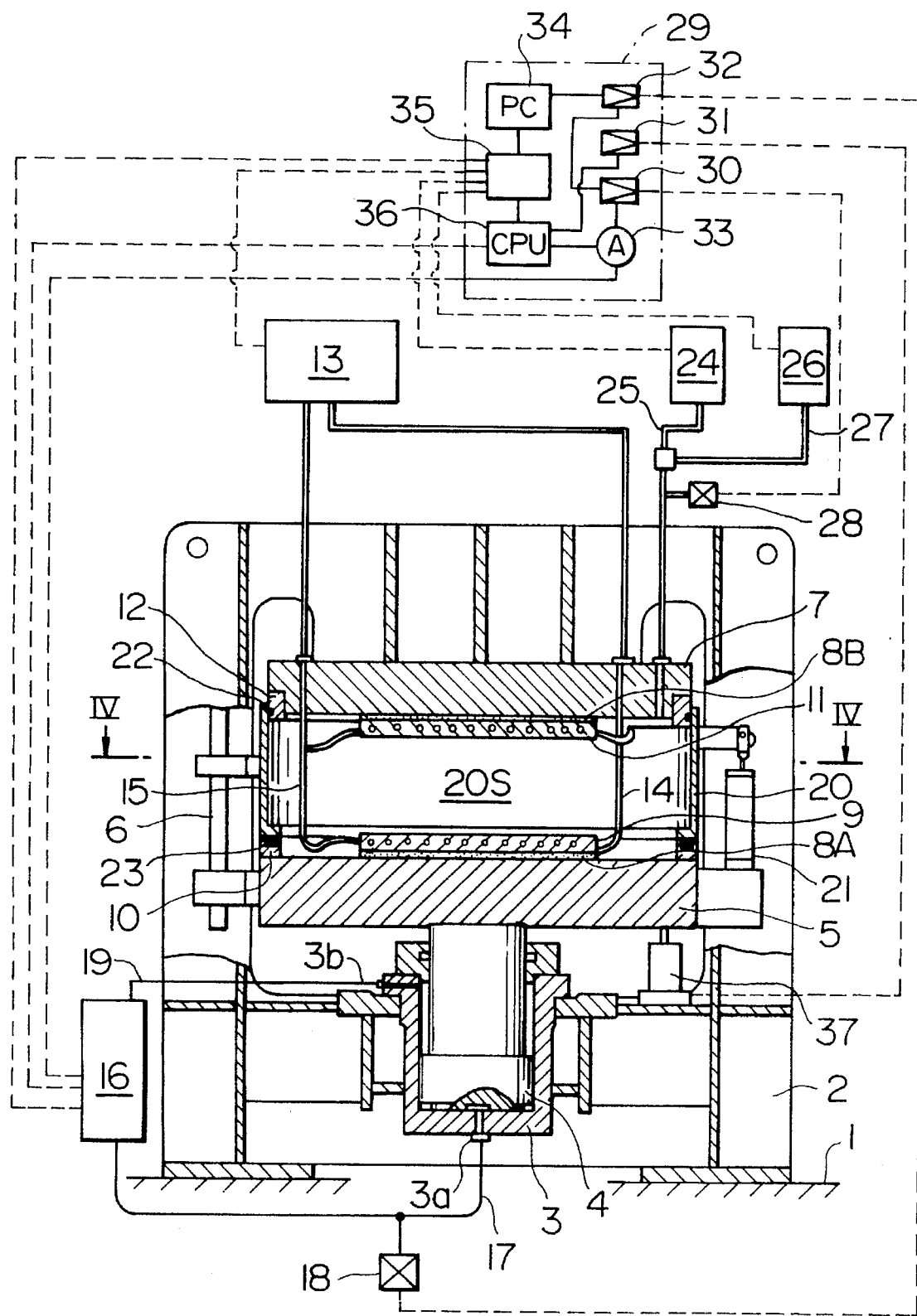
FIG. 1 is a vertical sectional view of an embodiment of a hot press according to the present invention, showing a sealed state formed by a cylindrical member.

Description will be given below of an embodiment of a hot press according to the present invention by reference to the accompanying drawings.

In the drawings, reference numeral 1 denotes a floor. A frame 2 is installed on the floor 1 and a main hydraulic cylinder 3 is provided at a center of a lower part of the frame 2. A lower bolster 5 is fixed to an upper end of a piston 4 of the main hydraulic cylinder 3, and is so guided as to be movable up and down by a plurality of guide rails 6 secured to the frame 2. The main hydraulic cylinder 3 and the piston 4 constitute a main hydraulic ram.

An upper bolster 7 is disposed in an upper part of the frame 2 at a position facing to the lower bolster 5. A lower hot plate 9 is attached to an upper surface of the lower bolster 5 through a heat insulating board 8A, and a cylindrical member receiving ring 10 is attached on lower bolster 5. Similarly, an upper hot plate 11 is attached to a lower surface of the upper bolster 7 through a heat insulating board 8B, and a cylindrical member guide 12 is attached to a periphery (side surface) of the upper bolster 7. The cylindrical member receiving ring 10 and the cylindrical member guide 12 are provided with sealing means 23 and 22, respectively.

Figure 4:
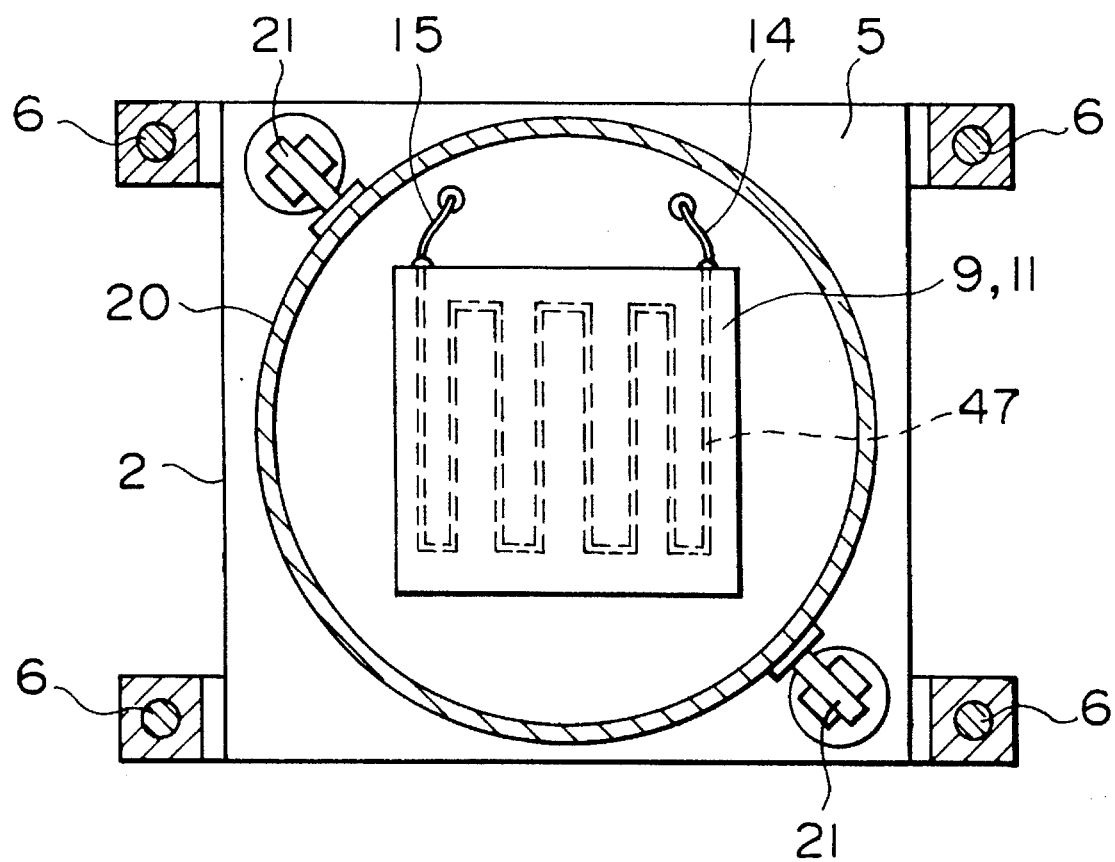
FIG. 4 is a cross-sectional view taken along line IV—IV in FIG. 1 and showing essential portions of a hot plate.

The lower hot plate 9 and the upper hot plate are each equipped therein with a supply hose 14, a return hose 15 and a passage 47 for heating medium such as steam, as shown in FIG. 4. On the other hand, the heating medium is supplied, as shown in FIG. 1, from a heat and cool source 13 constituting heat and cool means to the heating medium passages 47 in the lower hot plate 9 and the upper hot plate 11 through the respective heating medium supply hoses 14 and, after being subjected to heat exchange in the heating medium passages 47, returned to the heat and cool source 13 through the heating medium return hoses 15.

Referring back to FIG. 1, a pipe 17 leading from a hydraulic apparatus 16 is connected to a head-side port 3a of the main hydraulic cylinder 3, while another pipe 19 from the hydraulic apparatus 16 is connected to a rod-side port 3b of the main hydraulic cylinder 3. As a result, hydraulic fluid is supplied to a head side chamber and a rod side chamber of the main hydraulic cylinder 3. A pressure sensor 18 is provided on the way of the pipe 17 so that a pressure at which materials 38 of the multilayer circuit board are pressed by the main hydraulic cylinder 3 (hereinafter referred to as 'bonding pressure') is detected by the pressure sensor 18 and the detected pressure is sent to an arithmetic portion 32 of a control panel 29 which is to be described later.

Figure 5:
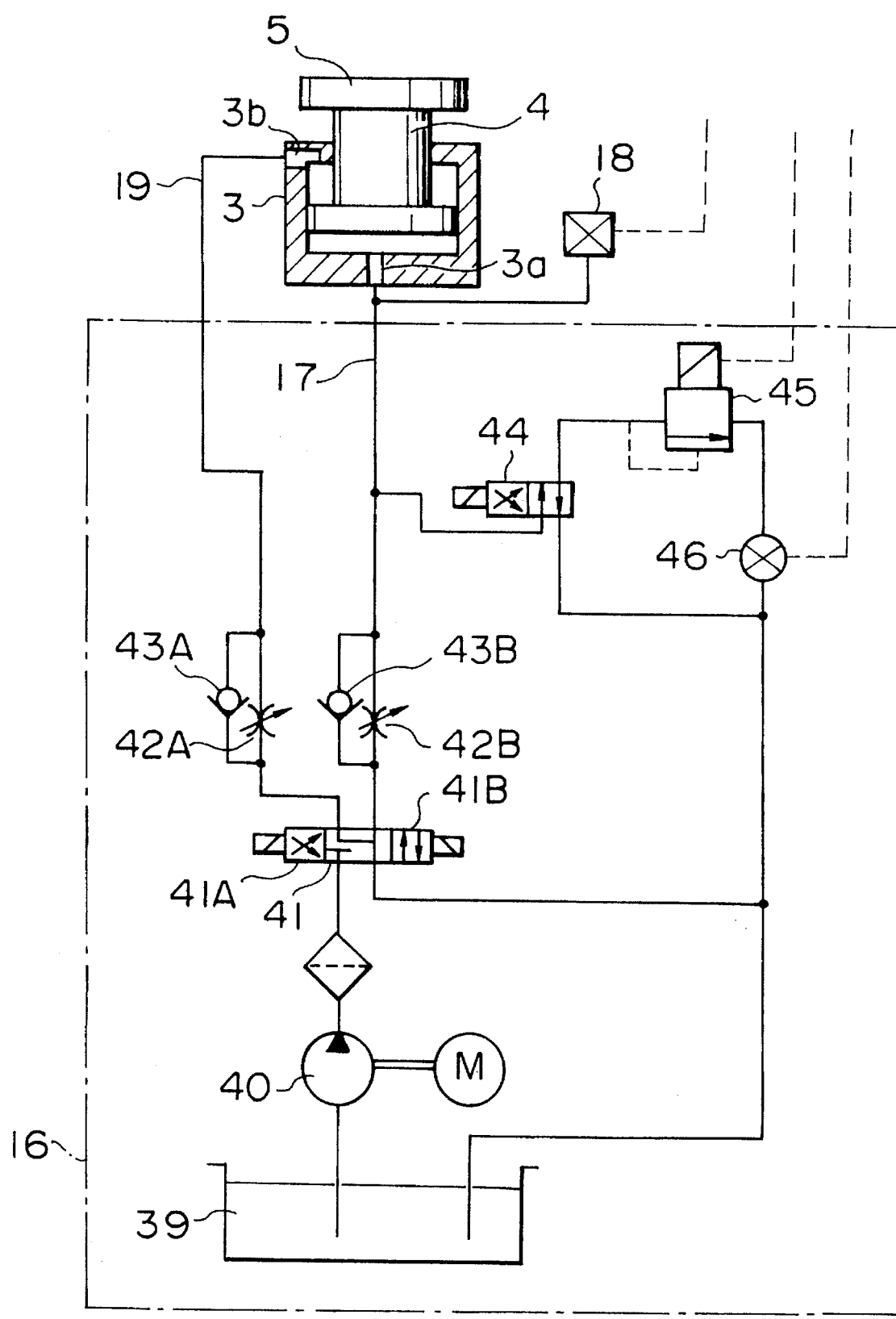
FIG. 5 is a diagram of hydraulic circuit of hydraulic apparatus of the hot press shown in FIG. 1.

As shown in FIG. 5, the hydraulic apparatus 16 comprises an oil reservoir 39, a hydraulic pump 40, a changeover valve 41, press ascending and descending speed control valves 42A and 42B, check valves 43A and 43B, another changeover valve 44, an electromagnetic proportional relief valve 45 and a relief flow meter 46.

Referring back to FIG. 1 again, a cylindrical member 20 is fitted on an outer periphery of the cylindrical member guide 12 attached to the periphery of the upper bolster 7. The cylindrical member 20 is attached to a lifting device 21 equipped on the lower bolster 5 so as to be movable up and down. The cylindrical member receiving ring 10, the cylindrical member guide 12 and the sealing means 22, 23 cooperate with each other to form a sealed space 20S within the cylindrical member 20. The interior of the sealed space 20S is communicated with a discharge means 24 and a gas supply means 26 through a discharge passage 25 and a gas pipe 27, respectively. As a result, the sealed space 20S can get a vacuum (reduced pressure) by discharging the air inside through the discharge passage 25 by means of the discharge means 24, while it can get a high pressure (increased pressure) by being supplied with gas through the gas pipe 27 by means of the gas supply means 26. A pressure sensor 28 is connected to the discharge passage 25 and the gas pipe 27 so that the pressure in the sealed space 20S is measured by the pressure sensor 28 and the measured pressure is sent to an arithmetic portion 30 of the control panel 29 which is to be described later.

Between a lower surface of the lower bolster 5 and the frame 2 is disposed a speed sensor 37 which serves to detect the displacement speed of the lower bolster 5, so that the moving speed of the piston 4 of the main hydraulic ram is detected by the speed sensor 37 and the measured value is sent to an arithmetic portion 31 of the control panel 29 to be described later.

In FIG. 1, reference numeral 29 denotes the control panel. The control panel 29 serves to control the heat and cool source 13, the hydraulic apparatus 16, the discharge means 24 and the gas supply means 26, and comprises the arithmetic portions 30, 31 and 32, a measuring portion 33 for measuring a control current of the pressure control valve (the aforesaid electromagnetic proportional relief valve 45 shown in FIG. 5), a process condition setting portion 34, an operation portion 35 and an air pressure addition command portion 36. The operation portion 35 is connected to the heat and cool source 13, the changeover valves 41, 44 of the hydraulic apparatus 16, the discharge means 24 and the gas supply means 26, severally, and the control current measuring portion 33 is connected to the electromagnetic proportional relief valve 45, and, furthermore, the air pressure addition command portion 36 is connected to the relief flow meter 46.

Next, operation of the hot press according to the present invention will be described.

Figure 2:
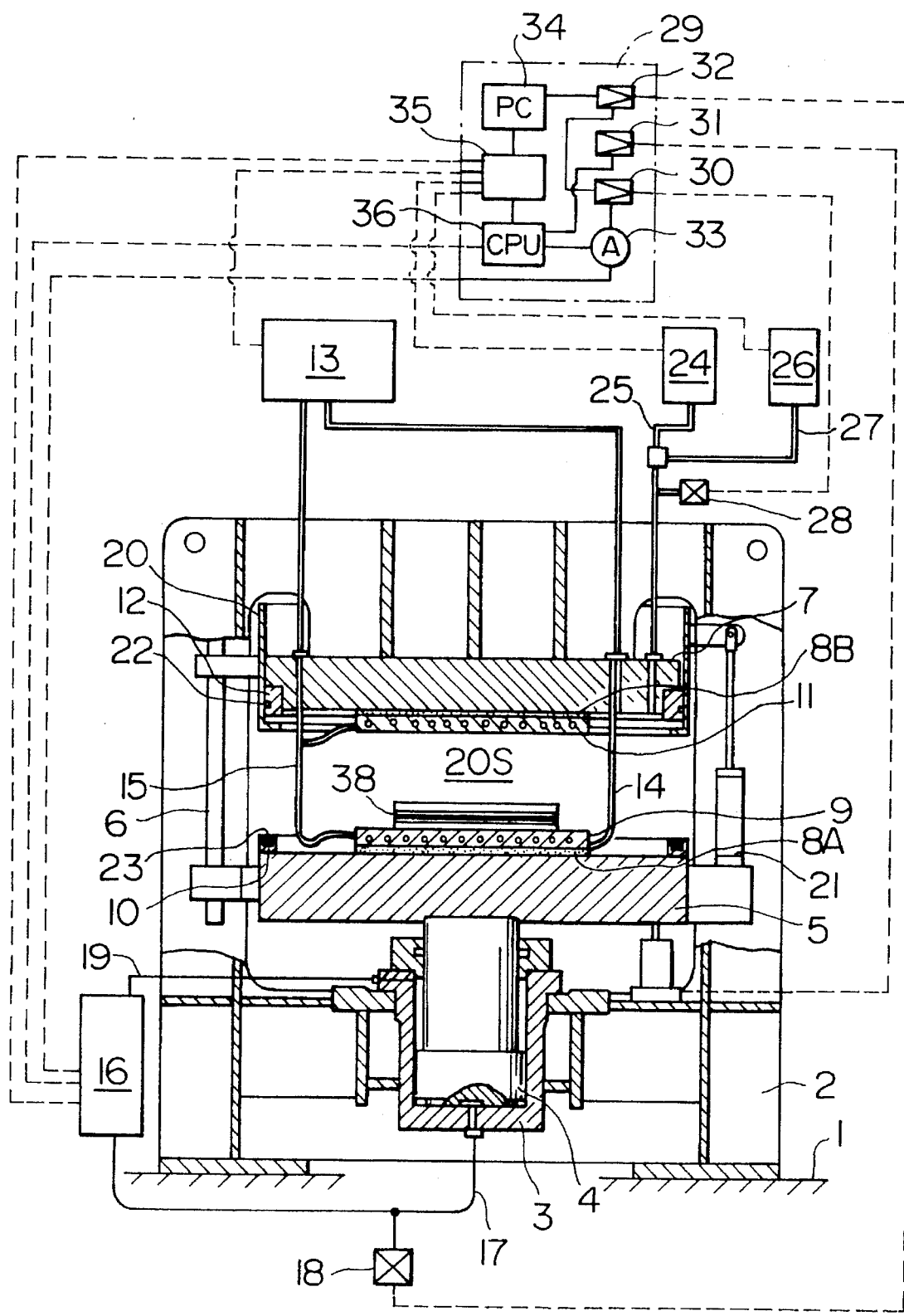
FIG. 2 is a vertical sectional view of the hot press shown in FIG. 1, showing a state that the cylindrical member is opened.

First, as shown in FIG. 2, the lifting means 21 is actuated to move the cylindrical member 20 up to an upper limit position, and the materials 38 of the multilayer circuit board are inserted between the upper hot plate 11 and the lower hot plate 9 and stacked in position on an upper surface of the lower hot plate 9. Then, as shown in FIG. 1, the lifting means 21 is actuated to lower the cylindrical member 20.

Subsequently, in order to prevent the lower bolster 5 from being moved up by action of negative pressure during discharging, the changeover valve 41 of the hydraulic apparatus 16 is changed to a position 41B to supply the hydraulic fluid under pressure from the hydraulic pump 40 to the rod-side chamber of the main hydraulic cylinder 3 through the rod-side port 3b and the pipe 19. As shown in FIG. 1, the sealed space 20S is formed within the cylindrical member 20 by the upper sealing means 22 and the lower sealing means 23. Then, in order to prevent the oxidation of the junctions as well as to remove the voids from between the layers, the discharge means 24 is actuated to discharge the air in the sealed space 20S so as to reduce the pressure to 5~50 Torr. After a predetermined degree of vacuum is obtained, the changed valve 41 is changeovered to a position 41A to discharge the hydraulic fluid under pressure in the rod-side chamber of the main hydraulic cylinder 3 from the rod-side port 3b and to supply the hydraulic fluid delivered from the hydraulic pump 40 to the head-side chamber of the main hydraulic cylinder 3 through the pipe 17 and the head-side port 3a. Accordingly, the lower bolster 5 is moved up and the materials 38 of the multilayer circuit board are subjected to the prepressing with a surface pressure of about 1~5 kgf/cm2 and preheating up to about 130° C. for the purpose that the uniform heat transmission and pressing can be effected on the materials 38 of the multilayer circuit board by the upper hot plate 11 and the lower hot plate 9.

After maintaining such state of temperature and pressure for 5~30 minutes, the bonding resin softens into fluidified state. As the viscosity of the bonding resin thus fluidified reaches the minimum viscosity, the inside of the cylindrical member 20 kept at the reduced pressure is restored to an atmospheric pressure. Thereafter, the materials 38 of the multilayer circuit board are pressed with a surface pressure of 5~30 kgf/cm$^2$, thereby effecting the bonding step.

In the state that the viscosity of the bonding resin of the multilayer circuit board is minimized during the bonding step, since a constant pressure is applied, the bonding resin outflow phenomenon will result in that the closing speed of the upper and lower bolsters 7 and 5 is maximized, that a relief amount of the pressure control valve (electromagnetic proportional relief valve) which serves to control the pressure between the upper and lower bolsters 7 and 5 is minimized, and that the control current of the pressure control valve (electromagnetic proportional relief valve) is maximized.

Figure 6:
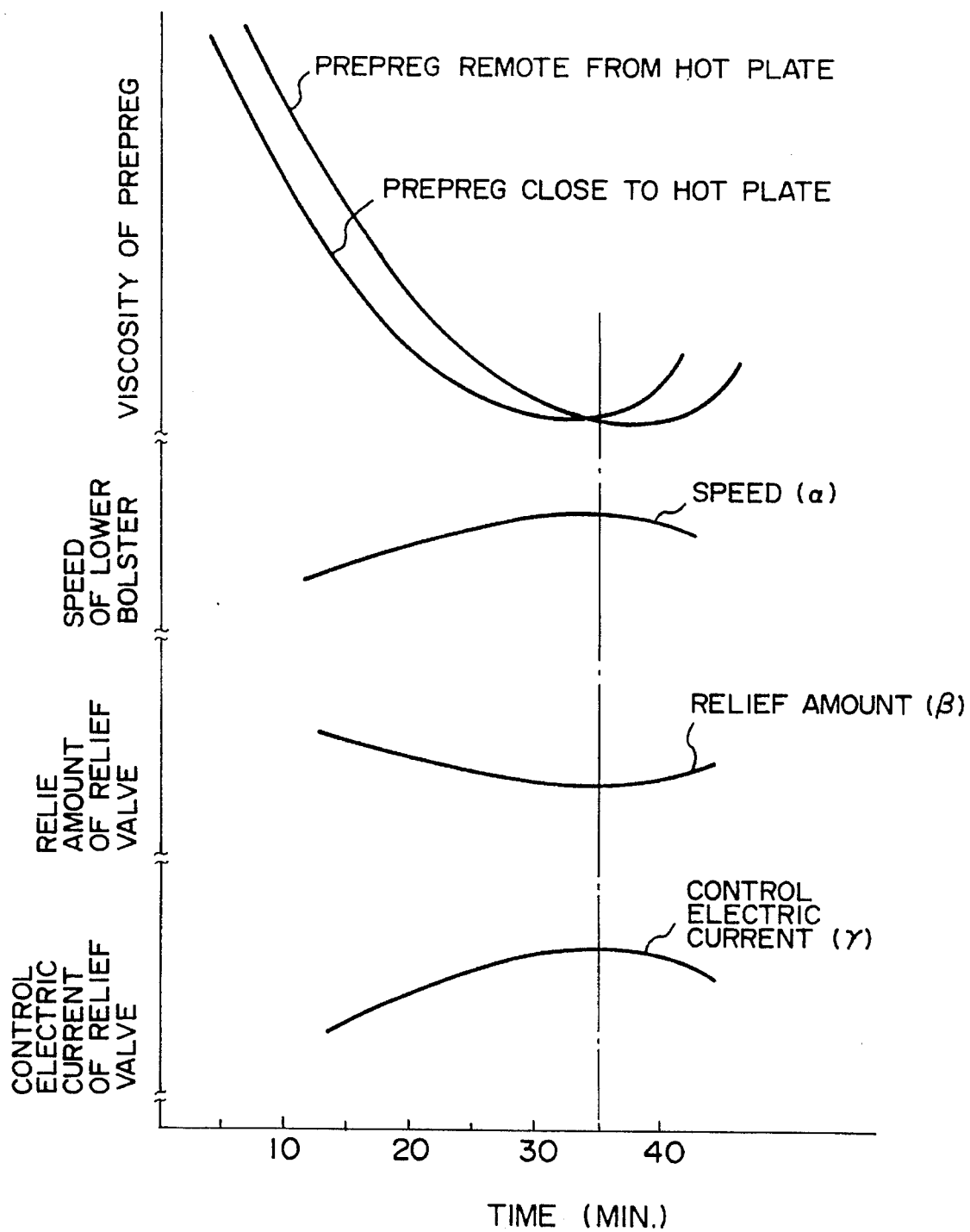
FIG. 6 is a graph showing a relationship between the viscosity of prepregs and operation phenomena of various parts of the hot press shown in FIG. 1.

In consequence, the fact that or the time when the bonding resin softens to reach the minimum viscosity can be detected in the following manner. Namely, as shown in FIG. 6, it is possible to obtain the time at which the speed is the highest by sending a detected value ($\alpha$) of the speed sensor 37 attached to the lower bolster 5 and the frame 2 to the arithmetic portion 31 of the control panel 29 from which the value ($\alpha$) is taken into the air pressure addition command portion 36 so as to be computed therein, the time at which the relief amount is the smallest by sending a detected value ($\beta$) of the relief flow meter 46 serving to detect the amount of relief of the electromagnetic proportional relief valve 45 to the air pressure addition command portion 36 of the control panel 29 where the value ($\beta$) is computed, or the time at which the control current is maximized by sending a measured value ($\gamma$) of the control current measuring portion 33 serving to measure the control current of the electromagnetic relief valve 45 to the air pressure addition command portion 36 where the value ($\gamma$) is computed. As described above, the sensors (the speed sensor 37, the relief flow meter 46 and the control current measuring portion 33) are each used as means for detecting the fact that the viscosity of the bonding resin is minimized.

It is sufficient to use one of the results detected by these sensors, and however, it is possible to detect with reliability that the viscosity of the bonding resin is minimized provided that a plurality of detection results are used at the same time as AND condition.

Substantially simultaneously with the start of the above-described bonding and pressing operation, a predetermined pressure of nitrogen or air is supplied from the gas supply means 26 into the sealed space 20S for the purpose of preventing the bonding pressure at the periphery of the materials 38 of the multilayer circuit board from being lowered. Although differed in accordance with the bonding resin and the bonding pressure, the pressure and time required for the supply of gas are generally 3~10 kgf/cm$^2$ and 30~60 minutes.

Further, to cope with the reduction of the bonding pressure caused by the reaction of the air pressure, the air pressure detected by the pressure sensor 28 is sent to the arithmetic portion 30 of the control panel 29 where the detected air pressure is computed for correction in accordance with the command value from the process condition setting portion 34 so that a pressure increase command value is sent to the electromagnetic proportional relief valve 45. After the required heating and gas-pressing are finished, a cooling medium is supplied from the heat and cool source 13 to the lower hot plate 9 and the upper hot plate 11 to cool the same, thereby cooling the multilayer circuit board 38. When the multilayer circuit board 38 is cooled down to about the room temperature, the pressing by the main hydraulic cylinder 3 is finished and, as shown in FIG. 2, the lower bolster 5 is moved down to the lower limit position thereof while the cylindrical member 20 is moved up to the upper limit position thereof, thus completing the bonding operation.

As described above, in the hot press according to this embodiment of the present invention, the time at which the viscosity of the bonding resin of the multilayer circuit board is minimized is not estimated from the experience and experiment but the softening-pour point of the bonding resin of the multilayer circuit board is found by detecting a change of the condition of the pressing means caused during the prepressing and preheating. As a result, in comparison with the prior art in which the working conditions have been determined according to the experience and sense of the workers, there are less unevenness in the quality of the multilayer circuit boards. It is therefore possible to produce the high-density and high-quality multilayer circuit board at low cost.

In the embodiment described above, the materials 38 of the multilayer circuit board are inserted between the upper and lower hot plates 11 and 9, and however, the present invention can be embodied as well by a hot press in which at least an intermediate hot plate is provided between the upper and lower hot plates 11 and 9 so that, by inserting the materials 38 of the multilayer circuit board between each adjacent hot plates, a plurality of multilayer circuit boards can be produced by one cycle of process. This is because the same amount of materials 38 of the multilayer circuit board is inserted between every adjacent pair of hot plates and the heat quantity supplied to every hot plate is equalized and the pressing is performed under the same conditions.

Further, the materials 38 of the multilayer circuit board may be inserted between the upper and lower 20 hot plates 11 and 9 and subjected to the heating and pressing as it is put on a jig plate of a good heat conductivity.

In addition, the output of the speed sensor 37 may be differentiated to obtain the acceleration or deceleration so as to detect the time at which the viscosity of the bonding resin is minimized by detecting the point of change of the acceleration or deceleration.

Figure 7:
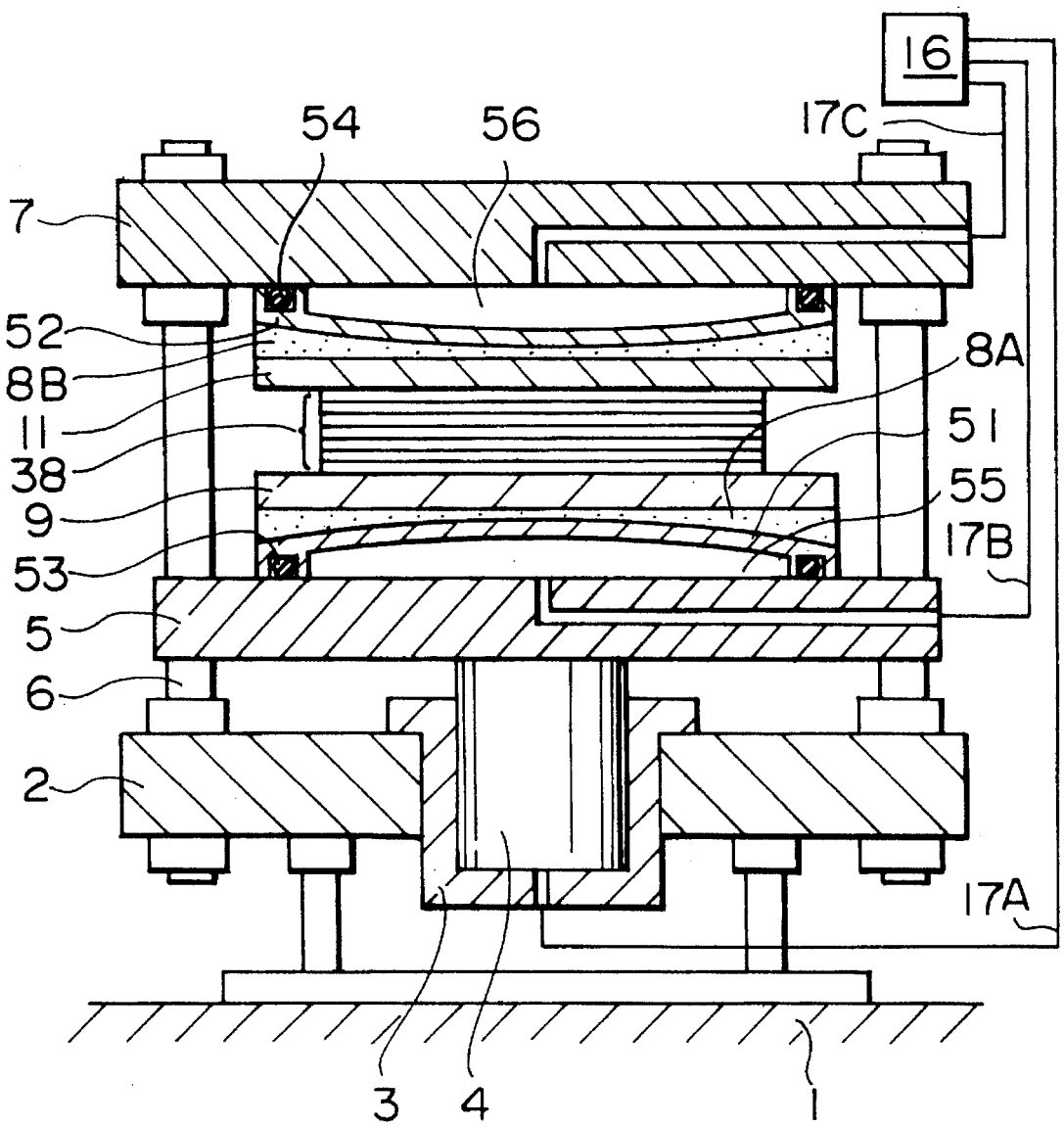
FIG. 7 is a schematic vertical sectional view of another embodiment of a hot press according to the present invention.

FIG. 7 is a schematic sectional view of another embodiment of a hot press according to the present invention. In the drawing, the same reference numerals as those of FIG. 1 denote the same components.

In the drawing, reference numerals 51 and 52 denote heat insulating board deformation correcting mechanisms each formed by an elastic member (very elastic member). These heat insulating board deformation correcting mechanisms 51 and 52 are fixed at the peripheries thereof to the bolsters 5 and 7 with bolts (not shown) and sealed by means of seal rings 53 and 54 so as to form oil pressure chambers (pressure chambers) 55 and 56, respectively. By feeding the hydraulic fluid under pressure from the hydraulic apparatus 16 into the oil pressure chambers 55 and 56 through the pipes 17B and 17C, respectively, the heat insulating board deformation correcting mechanisms 51 and 52 each receive a uniformly distributed load to swell out convexly toward the inside of the opposite surfaces thereof (a convex shape in which the thickness is the largest at the center and is made smaller as going toward the peripheral portion, that is, the convex shape which substantially corresponds to the shrinkage deformation of the heat insulating board 8A, 8B) like the plane board with its periphery securely fixed, thus varying the height as shown in FIG. 7. In this case, the hydraulic pressures applied to the upper and lower mechanisms can take either the same value or different values.

Description will be given of the forming of the materials by the hot press constructed as described above.

The materials 38 are set on the hot plate 9. The hydraulic fluid under pressure is fed from the hydraulic apparatus 16 into the cylinder 3 through the pipe 17A so that the ram 4 is driven to make the hot plate 9 move up until the upper surface of the materials 38 is brought into contact with the lower surface of the hot plate 11. The hot plates 9 and 11 are heated up to a predetermined temperature so that the materials 38 are heated while being pressed with a force about equal to the contact pressure. In this case, the pressing force is small and hence the heat insulating boards 8A, 8B are hardly deformed, and therefore, the heat insulating board deformation correcting mechanisms 51, 52 are not caused to operate and the contact surfaces thereof are parallel to the heat insulating boards 8A, 8B. After heating the materials 38 up to the predetermined temperature, the pressing force is increased up to the bonding load at a certain time so as to press-join the materials 38. At the same time as the pressure is increased, the hydraulic fluid under pressure is fed from the hydraulic apparatus 16 into the oil pressure chambers 55, 56 to deform the heat insulating board deformation correcting mechanisms 51, 52 in the shape of a convex bulging toward the inside of the opposite surfaces thereof so as to absorb the deformation of the heat insulating boards 8A, 8B and maintain the hot plates 9, 11 in parallel relation to each other. In this state, the materials 38 are heated and pressed for a predetermined period of time. Then, after being subjected to the cooling step, the materials 38 are formed. An amount of deformation of the heat insulating board deformation correcting mechanisms 51, 52 is determined by adjusting the value of the hydraulic pressure in such a manner that the heat insulating board deformation correcting mechanisms 51, 52 press back the heat insulating boards 8A, 8B by an amount determined from the shrinkage amount of the heat insulating boards 8A, 8B obtained beforehand by the preparatory experiment.

Figure 8:
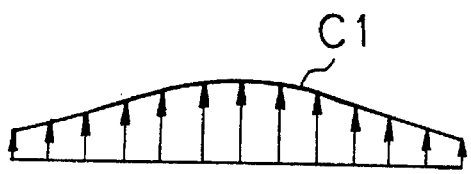
FIG. 8 is a pressure distribution chart obtained by the hot press shown in FIG. 7.

Since the hot press according to this embodiment of the present invention is constructed as described above, the deformation of the heat insulating boards 8A, 8B is absorbed uniformly by the uniformly distributed load of the heat insulating board deformation correcting mechanisms 51, 52, and accordingly, the pressure distribution is shown by a smooth curve like a pressure distribution C1 shown in FIG. 8, resulting in that it is possible to form a board with a uniform thickness. Further, the pressure is not lowered in the central portion of the circuit board materials 38, and accordingly, voids are discharged to the outside of the materials 38 satisfactorily.

Figure 9:
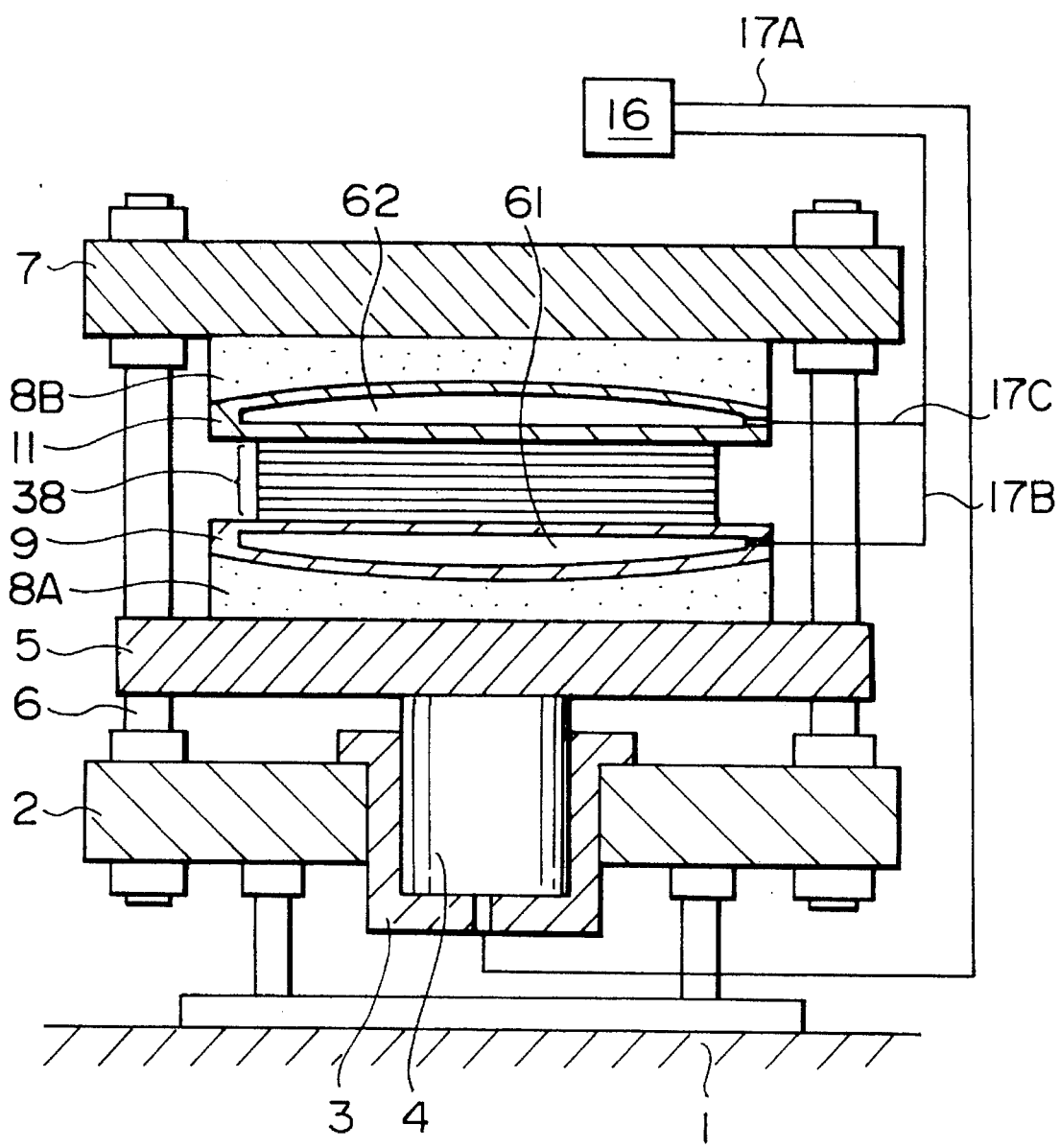
FIG. 9 is a schematic vertical sectional view of still another embodiment of a hot press according to the present invention.

FIG. 9 is a schematic sectional view of still another embodiment of a hot press according to the present invention. In the drawing, the same reference numerals as those of FIG. 7 denote the same components.

In the drawing, reference numerals 61 and 62 denote heat insulating board deformation correcting mechanisms. These heat insulating board deformation correcting mechanisms 61 and 62 are formed by the lower and upper hot plates 9 and 11 themselves, respectively, and each made of an elastic member (very elastic member) similarly to the heat insulating board deformation correcting mechanisms 51 and 52 of the aforesaid embodiment, and each have an oil pressure chamber (pressure chamber) formed therein. By supplying the hydraulic fluid from the hydraulic apparatus 16 into these oil pressure chambers through the pipes 17B and 17C, the heat insulating board deformation correcting mechanisms 61 and 62 are deformed in the shape of a convex bulging toward the inside of the opposite surfaces thereof similarly to the above-described embodiment, so that the deformation of the heat insulating boards 8A, 8B can be absorbed and hence the opposite surfaces of the hot plates 9, 11 can be kept in parallel relation to each other. Accordingly, the materials 38 can be pressed uniformly with a surface pressure the pressure distribution of which is continuously smoothed, with the result that a multilayer circuit board of a uniform thickness and a good flatness but with no void can be formed.

Figure 3:
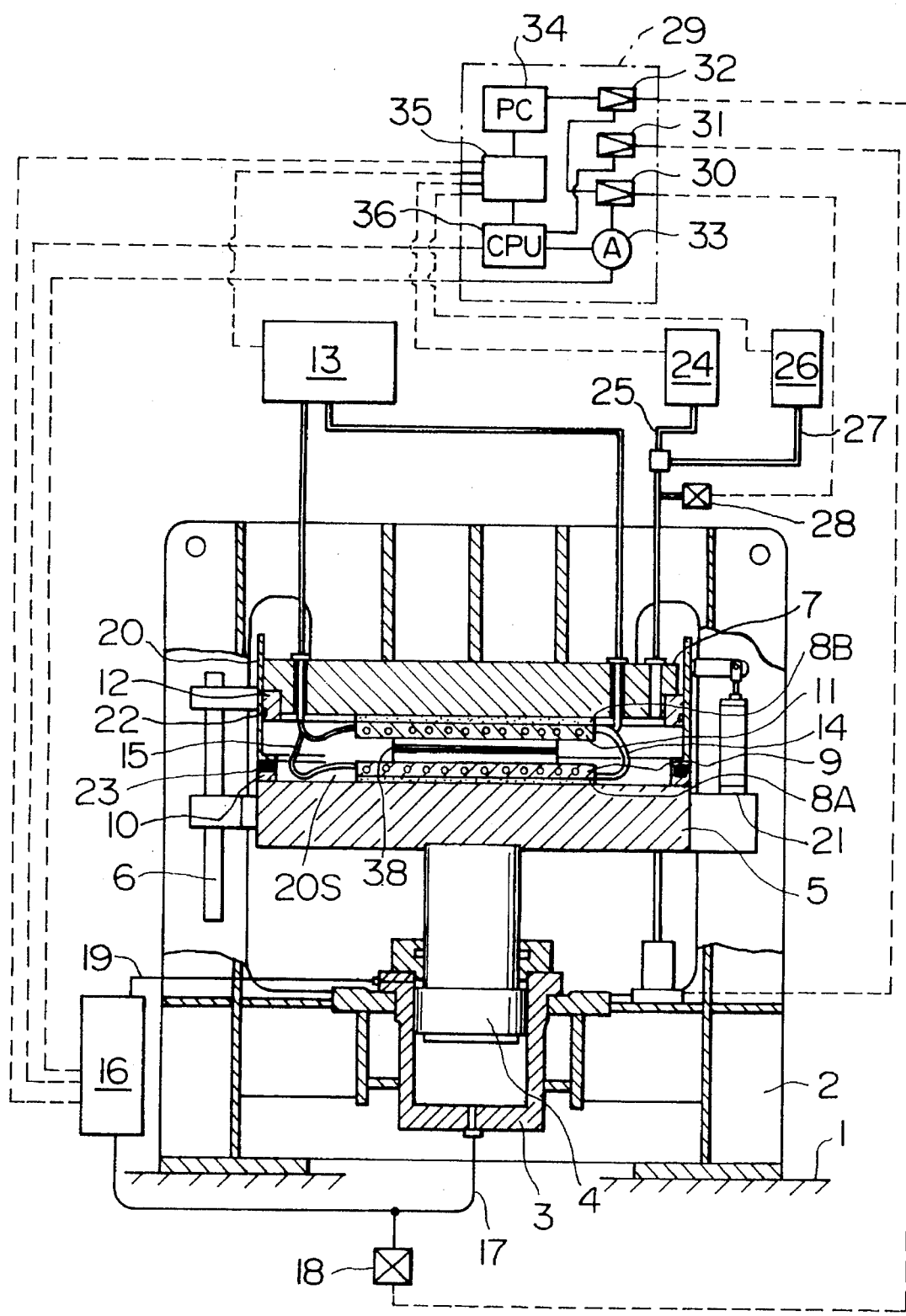
FIG. 3 is a vertical sectional view of the hot press shown in FIG. 1 when it is in the pressing state.

Further, although not illustrated, the upper and lower heat insulating boards 8B, 8A may be the ones including heat insulating board deformation correcting mechanisms as the hot plates 9, 11 of FIG. 3 are.

Figure 10:
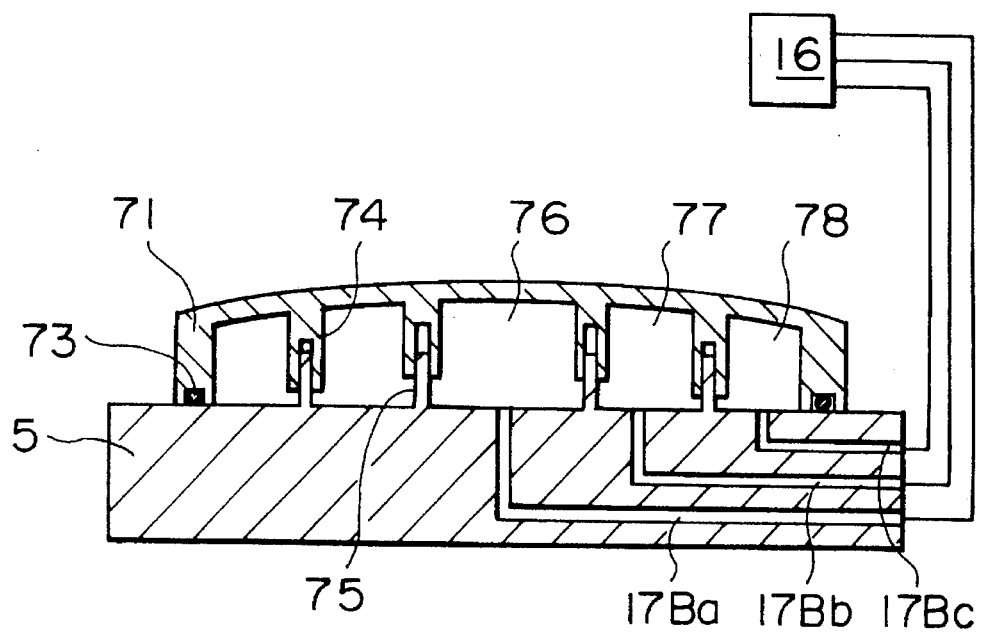
FIG. 10 is a partial schematic sectional view of a different embodiment of a hot press according to the present invention.

FIG. 10 is a partial schematic sectional view of a different embodiment of a hot press according to the present invention. In the drawing, the same reference numerals as those of FIG. 7 denote the same components.

Figure 12:
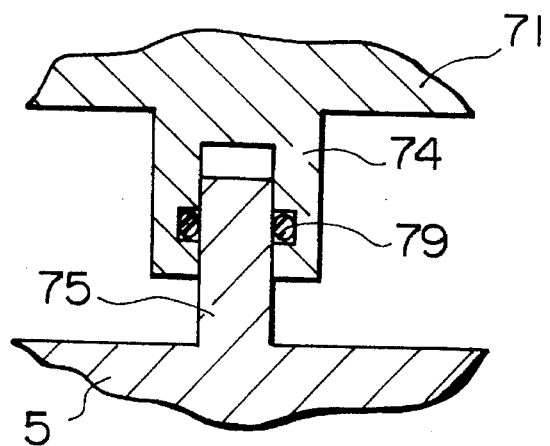
FIG. 12 is a schematic sectional view showing, on an enlarged scale, essential portions of the hot press shown in FIG. 10.

In the drawing, reference numeral 71 denotes a heat insulating board deformation correcting mechanism. This heat insulating board deformation correcting mechanism 71 is made of an elastic member (very elastic member) similarly to the heat insulating board deformation correcting mechanisms 51, 52 in the embodiment shown in FIG. 7, and it is fixed at the periphery thereof to the lower bolster 5 with bolts or the like (not shown) and formed therein with pressure chambers sealed by means of a seal ring 73. The inside of the heat insulating board deformation correcting mechanism 71 is divided into a plurality of pressure chambers by means of ring (annular) partition plates 74 and 75. In the case of FIG. 10, three pressure chambers 76~78 are formed concentrically. As shown in FIG. 12, the partition plate 75 is slidably inserted in the guide groove of the partition plate 74 so that the partition plate 74 is movable up and down. A seal ring 79 is used to seal the pressure chamber. The seal is not limited to such construction so far as the partition plate 74 can be moved up and down. Incidentally, description has been made about the heat insulating board deformation correcting mechanism 71 which is fixed to the lower bolster 5, and however, the upper bolster is also provided with the same heat insulating board deformation correcting mechanism in practice.

The hot press according to this embodiment of the present invention is constructed as described above, and operation thereof will be described below.

Figure 11:
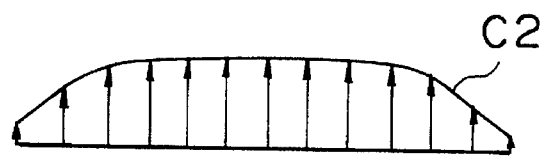
FIG. 11 is a pressure distribution chart obtained by the hot press shown in FIG. 10.

First, as the oil pressure chambers 76~78 are supplied with the hydraulic fluids of individual pressure values from the hydraulic apparatus 16 through passages 17Ba~17Bc, the heat insulating board deformation correcting mechanism 71 is caused to swell upwards convexly. By varying the pressure values of the hydraulic fluids supplied to the oil pressure chambers 76–78, the swelling amounts of the upper surfaces of the oil pressure chambers 76–78 can be changed, thereby making it possible to give an arbitrary pressure distribution to the materials 38. For example, it is also possible to give such a pressure distribution that the pressure is uniform in the central portion and is lowered gradually in the peripheral portion like a pressure distribution C2 shown in FIG. 11. It is noted here that, since the oil pressure chambers 76–78 are adjacent very close to each other through the partition plates 74, 75, the swellings of the upper surfaces of the adjacent oil pressure chambers 76–78 interfere with each other to prevent the occurrence of such a pressure distribution that shows an extreme difference between the oil pressure chambers 76–78, even if the pressure values of the hydraulic fluids supplied to the oil pressure chambers 76–78 are varied to change the swelling amounts. According to this embodiment, therefore, it is possible to give an arbitrary pressure distribution to the materials 38 smoothly and hence to suppress the generation of voids.

The heat insulating board deformation correcting mechanism which has a plurality of divided pressure chambers as shown in FIG. 10 can be applied also to the hot press of FIG. 9 in which the hot plate itself serves as the heat insulating board deformation correcting mechanism and to the hot press which is a modification of the hot press of FIG. 9 and in which the heat insulating board itself serves as the heat insulating board deformation correcting mechanism.

In the embodiments shown in FIGS. 7, 9 and 10 and the above-described modification as well, by providing at least one intermediate hot plate between the hot plates 9 and 11 and inserting the multilayer circuit board materials 38 between each adjacent hot plates, a plurality of multilayer circuit boards can be heated, pressed and formed at a time by once driving the ram.

By combining the embodiment shown in FIG. 1 with any of the embodiments shown in FIGS. 7, 9 and 10, it is possible to obtain a more excellent multilayer circuit board, that is, a multilayer circuit board of a uniform thickness but with no void.

What is claimed is:

1. A hot press for producing a multilayer circuit board comprising:

upper and lower bolsters disposed opposite to each other in the vertical direction;

upper and lower hot plates attached to said bolsters respectively so as to be opposed to each other between said both bolsters;

sealing means for defining a space with said bolsters and for sealing said space;

pressing means for pressing multilayer circuit board materials including circuit boards and bonding resin stacked in layers alternately and set between said hot plates by moving at least one of said bolsters with respect to the other;

heating and cooling means for heating and cooling said hot plates;

heat insulating boards respectively provided between said bolsters and said hot plates;

vacuum/high pressure means for providing the inside of said space formed by said sealing means with a vacuum or a high pressure;

controlling means for controlling said pressure means, said heating and cooling means and said vacuum/high pressure means so as to provide said space with a vacuum in a state that said multilayer circuit board materials are set between said hot plates and, then, provide said space with a high pressure as well as heat and press said multilayer circuit board materials; and detecting means for detecting a minimum viscosity of the bonding resin of said multilayer circuit board materials during the heating and pressing of said multilayer circuit board materials, wherein said detecting means is at least one of those which detects a minimum relief amount of a pressure control valve of said pressing means and a maximum control current of said pressure control valve;

said controlling means comprising means for changing-over an atmosphere in said space from a vacuum condition to a high pressure condition substantially simultaneously with the time at which the pressure applied to said multilayer circuit board materials by said pressing means is changed over from a pre-pressure to a bonding pressure larger than said pre-pressure in accordance with a detection result of said detecting means.

2. A hot press for producing a multilayer circuit board according to claim 1, wherein said pressing means comprises a main hydraulic ram which serves to move at least one of said both bolsters with respect to the other and an electromagnetic proportional relief valve which serves to control the pressure of said main hydraulic ram.

3. A hot press for producing a multilayer circuit board comprising:

upper and lower bolsters disposed opposite to each other in the vertical direction;

upper and lower hot plates attached to said bolsters respectively so as to be opposed to each other between said both bolsters;

heating and cooling means for heating and cooling said hot plate;

heat insulating boards respectively provided between said bolsters and said hot plates;

pressing means for pressing multilayer circuit board materials including circuit boards and bonding resin stacked in layers alternately and set between said both hot plates by moving at least one of said bolsters with respect to the other, means for correcting deformation provided between said bolsters and said hot plates and each formed by an elastic pressure container and changed its shape, when hydraulic fluid under pressure is supplied into said container, into a convex form the thickness of which is the largest in the center and is made smaller as going toward the peripheral portion so as to correct deformation of said heat insulating board at the time of heating and pressing said multilayer circuit board materials;

sealing means for defining a space with said bolsters and for sealing said space;

vacuum/high pressure means for providing the inside of said space formed by said sealing means with a vacuum or a high pressure;

controlling means for controlling said pressure means, said heating and cooling means and said vacuum/high pressure means so as to provide said space with a vacuum in a state that said multilayer circuit board materials are set between said both hot plates and, then, provide said space with a high pressure as well as heat and press said multilayer circuit board materials; and detecting means for detecting a minimum viscosity of the bonding resin of said multilayer circuit board materials during the heating and pressing of said multilayer circuit board materials, wherein said detecting means is at least one of those which detects a minimum relief amount of a pressure control valve of said pressing means and a maximum control current of said pressure control valve;

said controlling means comprising means for changing-over an atmosphere in said space from a vacuum condition to a high pressure condition substantially simultaneously with the time at which the pressure applied to said multilayer circuit board materials by said pressing means is changed over from a pre-pressure to a bonding pressure larger than said pre-pressure in accordance with a detection result of said detecting means.

4. A hot press for producing a multilayer circuit board comprising:

upper and lower bolsters disposed opposite to each other in the vertical direction;

upper and lower hot plates attached to aid bolsters respectively so as to be opposed to each other between said both bolsters;

heating and cooling means for heating and cooling said hot plates;

heat insulating boards provided between said bolsters and said hot plates;

pressing means for pressing multilayer circuit board materials including circuit boards and bonding resin stacked in layers alternately and set between said hot plates by moving at least one of said bolsters with respect to the other, wherein one of said hot plate and said heat insulating board is formed by an elastic pressure container and changed its shape, when a hydraulic fluid under pressure is supplied into said container, into a convex form the thickness of which is the largest in the center and is made smaller as going toward the peripheral portion so as to correct deformation of said heat insulating board at the time of heating and pressing said multilayer circuit board materials;

sealing means for defining a space with said bolsters and for sealing said space;

vacuum/high pressure means for providing the inside of said space formed by said sealing means with a vacuum or a high pressure;

controlling means for controlling said pressure means, said heating and cooling means and said vacuum/high pressure means so as to provide said space with a vacuum in a state that said multilayer circuit board materials are set between said both hot plates and, then, provide said space with a high pressure as well as heat and press said multilayer circuit board materials; and detecting means for detecting a minimum viscosity of the bonding resin of said multilayer circuit board materials during the heating and pressing of said multilayer circuit board materials, wherein said detecting means is at least one of those which detects a minimum relief amount of a pressure control valve of said pressing means and a maximum control current of said pressure control valve;

said controlling means comprising means for changing-over an atmosphere in said space from a vacuum condition to a high pressure condition substantially simultaneously with the time at which the pressure applied to said multilayer circuit board materials by said pressing means is changed over from a pre-pressure to a bonding pressure larger than said pre-pressure in accordance with a detection result of said detecting means.

5. A hot press for producing a multilayer circuit board according to claim 3 or 4, wherein the inside of said pressure container is divided into a plurality of pressure chambers so that a fluid of an arbitrary pressure is supplied to each of said divided pressure chambers.

6. A hot press for producing a multilayer circuit board according to claim 3 or 4, further comprising:

sealing means for defining a space with said bolsters and for sealing said space;

vacuum/high pressure means for providing the inside of said space formed by said sealing means with a vacuum or a high pressure;

controlling means for controlling said pressure means, said heating and cooling means and said vacuum/high pressure means so as to provide said space with a vacuum in a state that said multilayer circuit board materials are set between said both hot plates and, then, provide said space with a high pressure as well as heat and press said multilayer circuit board materials; and detecting means for detecting a minimum viscosity of the bonding resin of said multilayer circuit board materials during the heating and pressing of said multilayer circuit board materials, said controlling means comprising means for changing-over an atmosphere in said space from a vacuum condition to a high pressure condition substantially simultaneously with the time at which the pressure applied to said multilayer circuit board materials by said pressing means is changed over from a pre-pressure to a bonding pressure larger than said pre-pressure in accordance with a detection result of said detecting meads.

7. A hot press for producing a multilayer circuit board according to claim 6, wherein said detecting means is at least one of those which detects a maximum moving speed of said pressing means, a change in the acceleration or deceleration of said pressing means, a minimum relief amount of a pressure control valve of said pressing means and a maximum control current of said pressure control valve.

8. A hot press for producing a multilayer circuit board according to claim 1, wherein said detecting means detects the minimum relief amount of the pressure control valve of said pressing means.

9. A hot press for producing a multilayer circuit board according to claim 1, wherein said detecting means detects the maximum control current of said pressure control valve.

10. A hot press for producing a multilayer circuit board according to claim 2, wherein said detecting means detects a minimum relief amount of said electromagnetic proportional relief valve.

11. A hot press for producing a multilayer circuit board according to claim 2, wherein said detecting means detects a maximum control current of said electromagnetic proportional relief valve.

* * * * *